United States Patent [19]

Kearney et al.

[11] Patent Number: 5,619,122

[45] Date of Patent: *Apr. 8, 1997

[54] TEMPERATURE DEPENDENT VOLTAGE GENERATOR WITH BINARY ADJUSTABLE NULL VOLTAGE

[75] Inventors: Mark B. Kearney, Kokomo; Dennis M. Koglin, Carmel, both of Ind.

[73] Assignee: Delco Electronics Corporation, Kokomo, Ind.

[*] Notice: The term of this patent shall not extend beyond the expiration date of Pat. No. 5,534,816.

[21] Appl. No.: 422,341

[22] Filed: Apr. 14, 1995

[51] Int. Cl.$^6$ .............................. G05F 3/08; H01L 35/00; H03M 1/06

[52] U.S. Cl. .......................... 323/312; 323/907; 327/513; 341/119

[58] Field of Search .................................... 323/315, 907, 323/312; 327/512, 513, 362; 341/119

[56] References Cited

U.S. PATENT DOCUMENTS 4,885,585  12/1989  Barrow et al. ........................... 341/169
4,899,152  2/1990  Barrow et al. ........................... 341/154
5,440,520  8/1995  Schutz et al. ........................... 365/226
5,534,816  7/1996  Koglin et al. ........................... 327/513

Primary Examiner—Peter S. Wong
Assistant Examiner—Adolf Berhane
Attorney, Agent, or Firm—Jimmy L. Funke

[57] ABSTRACT

In accordance with the teachings of the present invention, a temperature dependent voltage generator circuit is provided for generating an output voltage that changes proportionally with changes in the operating temperature of the temperature dependent voltage generator circuit. The temperature dependent voltage generator circuit includes binary weighted current sources and electronic switches that are selectively closed in order to produce a binary weighted current. The binary weighted current is adjustable such that the output voltage of the temperature dependent voltage generator circuit may be "nulled" or forced to zero at any given operating temperature.

16 Claims, 2 Drawing Sheets

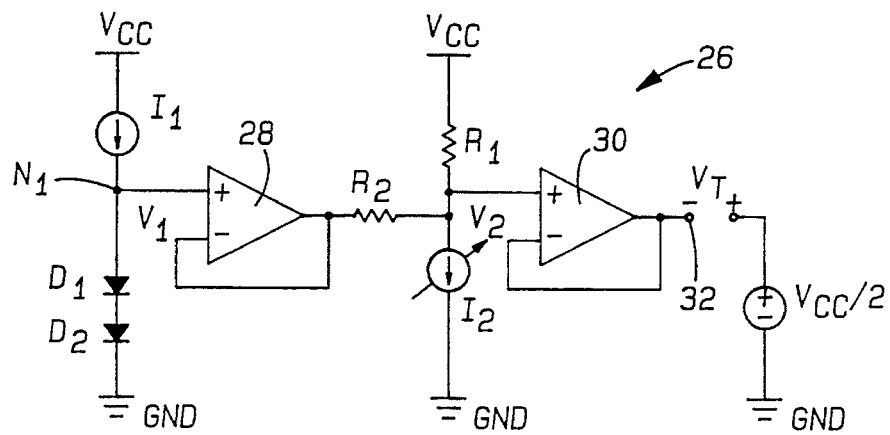
Fig-2
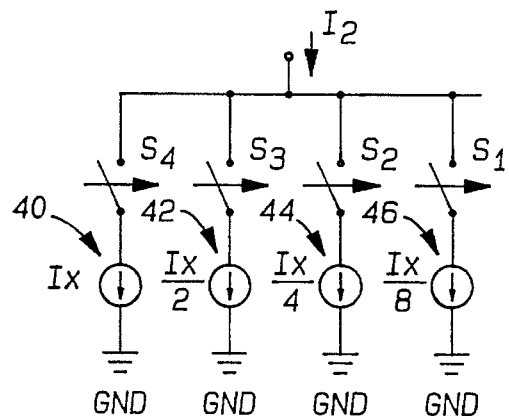
Fig-3
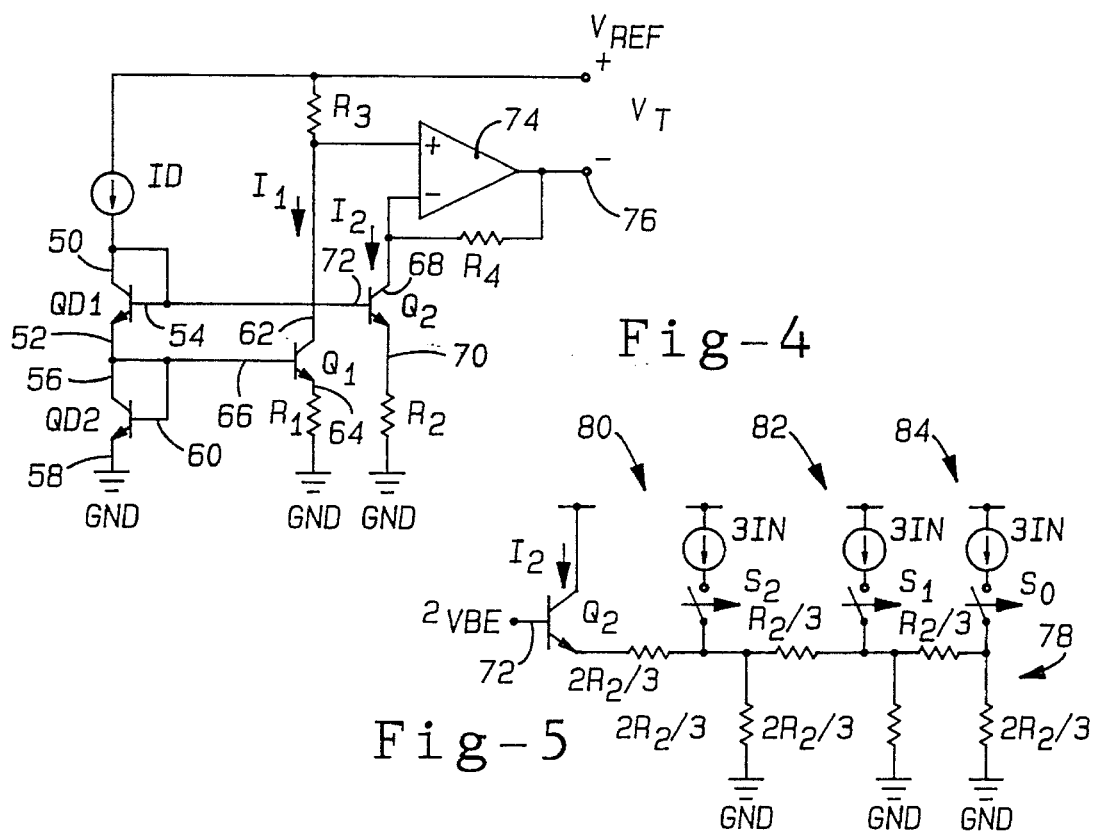
Fig-4
Fig-5

TEMPERATURE DEPENDENT VOLTAGE GENERATOR WITH BINARY ADJUSTABLE NULL VOLTAGE

BACKGROUND OF THE INVENTION

1. Technical Field

This invention relates generally to integrated signal conditioning circuitry and, more particularly, to a temperature dependent voltage generator circuit and method for generating a voltage which is linearly related to changes in the operating temperature of the voltage generator circuit and which may be "nulled" or forced to equal zero in order to compensate for effects due to temperature variations.

2. Discussion

Integrated amplifier circuits are commonly employed for amplifying output signals produced by a transducer. The transducer and integrated amplifier circuit is generally calibrated during a calibration process to set initial gain and offset and generate a compensated calibrated output voltage. Often, these types of integrated circuits and transducers are subject to operating temperature variations which affect their operational characteristics. For example, operating temperature variations may affect the output of a transducer and, in turn, affect the gain and offset adjustments of an integrated amplifier circuit, resulting in an uncompensated output signal which may result in an inaccurate reading.

Typically, the gain and offset adjustments of an integrated amplifier circuit are adjusted at a first operating temperature such that the amplifier circuit generates a desired output signal. However, with variations in the operating temperature of the transducer and/or the amplifier circuit, unwanted effects on the output signal may be generated. Commonly, these unwanted effects are minimized by physically calibrating the individual components of the amplifier circuit prior to its final assembly. For example, the components may be individually calibrated with laser trimming techniques or through adjustment of resistive values of resistor networks by blowing fusible links. Unfortunately, these calibration techniques require physical access to the components of the amplifier circuit which are normally enclosed or encapsulated in a packaged housing after final assembly. Therefore, with laser trimming or fusible techniques, the calibration process must be performed prior to final assembly of the amplifier circuit.

Thus, it would be desirable to provide an integrated amplifier circuit and a method for compensating for signal variations due to changes in the operating temperature of the integrated amplifier circuit and/or a transducer without requiring physical access to the components of the amplifier. Furthermore, it would be desirable to provide a temperature dependent voltage generator circuit which generates an output signal which may be "nulled" or forced to zero at a first operating temperature and which thereafter generates an output signal that is proportional to changes in the operating temperature from the first temperature. For example, this output signal may be supplied to primary and secondary gain and offset circuits of an integrated amplifier circuit in order to compensate for the unwanted effects due to temperature variation.

One of the objects of the present invention is to provide a temperature dependent voltage generator circuit and method that generates an output voltage that may advantageously be "nulled" at any temperature and which thereafter, generates an output voltage that varies proportionally to changes in temperature.

Another object of the present invention is to provide a temperature dependent voltage generator circuit and method that employs a binary weighted current which is weighted by selectively coupling a plurality of current sources to the generator circuit so as to "null" the output voltage.

SUMMARY OF THE INVENTION

In accordance with the teachings of the present invention, a temperature dependent voltage generator circuit is provided with adjustable null voltage capability and which generates an output voltage that is proportional to changes in the operating temperature of the voltage generator circuit. A temperature dependent voltage source produces a voltage that varies substantially linearly with changes in the operating temperature of the voltage generator circuit from a first operating temperature. A binary weighted switched current source is provided for generating an adjustable binary weighted current. At a first operating temperature, the binary weighted current is adjustable so as to "null" the output voltage of the generator circuit. Thereafter, at another operating temperature, the temperature dependent voltage generator produces an output voltage which is proportional to the change in the operating temperature from the first operating temperature.

In accordance with a preferred embodiment, the binary weighted switched current source includes a plurality of selectable parallel-coupled binary weighted current sources. The current sources are selected via electronic switches for weighting the adjustable binary weighted current.

BRIEF DESCRIPTION OF THE DRAWINGS

Other objects and advantages of the present invention will become apparent to those skilled in the art upon reading the following detailed description and upon reference to the drawings in which:

FIG. 2 is a circuit diagram illustrating a first embodiment of a temperature dependent voltage generator circuit with adjustable "null" capability;

FIG. 3 is a circuit diagram illustrating binary weighted current sources used to produce the binary weighted current I2 shown in FIG. 2;

FIG. 4 is a circuit diagram illustrating an alternate embodiment of the temperature dependent voltage generator circuit with adjustable null capability; and FIG. 5 is a circuit diagram illustrating a binary weighted switched current source which replaces resistor R2 in FIG. 4 for supplying a binary weighted current.

DETAILED DESCRIPTION OF THE PREFERRED EMBODIMENTS

Figure 1:
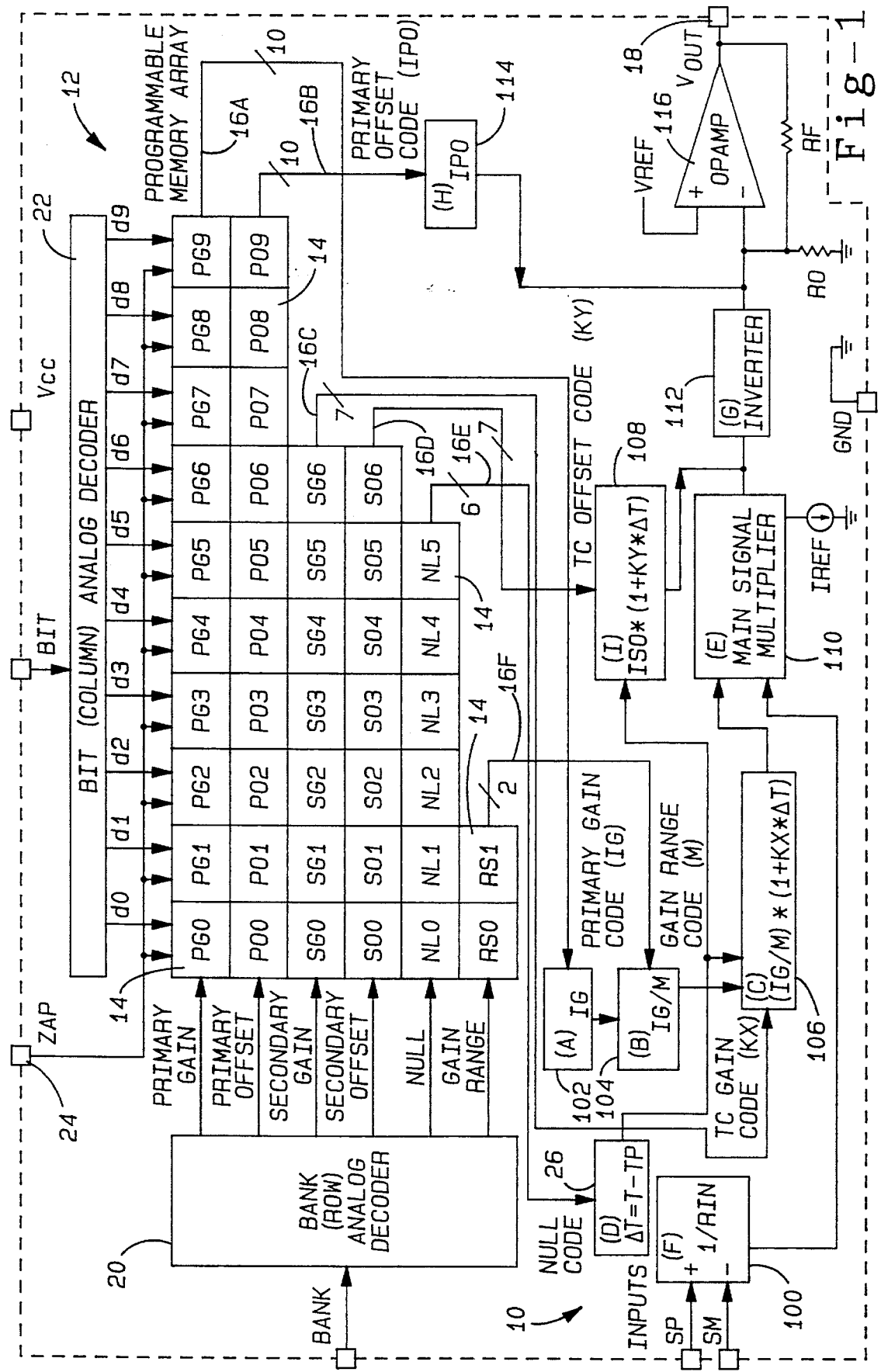
FIG. 1 is a block diagram of a piezoresistive transducer amplifier circuit containing a temperature dependent voltage generator circuit.

Turning now to FIG. 1, a piezoresistive transducer amplifier circuit 10 is shown interconnected to an electronically programmable memory array 12 which employs "zener-zap" memory cells 14. According to the example shown, the transducer amplifier circuit 10 has inputs for receiving differential outputs SP and SM from a piezoresistive transducer (not shown). The amplifier circuit 10 of the present invention is particularly suited for use in conjunction with a piezoresistive strain sensing transducer such as a pressure or an accelerometer transducer. These transducer outputs are typically very small and therefore require amplification to an amplitude that is more easily usable.

Each of the memory cells 14 have outputs that are coupled to the amplifier circuit 10 via lines 16A–16F. The transducer amplifier circuit 10 generates programmed binary bit signals which are provided by each of the memory cells 14. The binary bit signals provide digital coding which is used to program the amplifier circuit 10. The amplifier circuit 10 amplifies the transducer outputs SP and SM such that a compensated calibrated single-ended output voltage $V_{OUT}$ is generated at output line 18.

Each of the memory cells 14 in the electronically programmable memory array 12 are individually addressable via row decoder 20 and column decoder 22. Each of the memory cells 14 receive row and column address voltages from the decoders 20 and 22. When properly addressed, the memory cells 14 can be individually tested and/or programmed so as to output binary signals for adjusting amplifier characteristics, such as gain and offset, of the transducer amplifier circuit 10. Additionally, the memory cells 14 can be individually tested and/or programmed so as to output binary signals for adjusting a temperature dependent voltage generator 26 which is part of transducer amplifier circuit 10. In order to minimize the number of interconnections required for individually testing and/or programming the memory cells 14, each of the memory cells 14 have a common connection to a zap voltage line 24. The zap voltage line 24 is coupled to a voltage supply which provides varying voltage levels. The circuit and methods of testing and programming the memory cells 14 is disclosed in commonly co-filed application Serial No. H-187805, titled "Integrated Zener-Zap Nonvolatile Memory Cell With Programming And Pretest Capability", and which is hereby incorporated by reference.

Also shown in FIG. 1 is a temperature dependent voltage generator 26 which receives null code binary signals from the programmable memory 12 via line 16E. The temperature dependent voltage generator 26 therefore receives six bits of code according to the embodiment shown. Also included is a voltage to current converter for converting the received transducer outputs SP and SM to a current signal. A primary gain code block 102 is coupled to line 16A and a gain range code block 104 is coupled to line 16F. A temperature control gain code block 106 and temperature compensation offset code block 108 are coupled to lines 16C and 16D. A main signal multiplier 110 and inverter 112 feed an inverting input (−) of an operational amplifier 116. Operational amplifier 116 further includes a non-inverting input (+) for receiving a reference voltage $V_{REF}$. In effect, gain and offset of the operational amplifier 116 are adjustable via the inverting (−) input thereof. A detailed description of blocks 100–116 is provided in co-filed application Serial Nos. D.E. Nos. H-187804 titled "Integrated Transducer Amplifier With Zener-Zap Programming" and H-188960 titled "Programmable Transducer Amplifier Circuit".

The transducer amplifier circuit 10 is adapted for use in a vehicle (not shown), such as an automobile. More particularly, this invention will be described for use in conditioning signals from a pressure transducer or a motion/accelerometer or other similar sensing device. However, it is to be understood that the use of this invention is not restricted to automobiles, amplifiers, transducers or sensors, but could have other uses in other applications requiring signal conditioning in order to compensate for variations due to changes in operating temperature.

When employed in an environment with changing temperatures, the physical characteristics of the amplifier circuit 10 and/or the transducer are affected such that unwanted variations in the output voltage $V_{OUT}$ are generated. Therefore, in order to compensate for these variations, the amplifier circuit 10 includes the temperature dependent voltage generator 26, illustrated by block (D), which produces an output voltage that is used to compensate for such variations in temperature.

When a conditioning circuit such as amplifier circuit 10 exhibits characteristic changes due to temperature, it is desirable to compensate for the effects of temperature variation. To do so, a linear function of temperature may be used to compensate for such effects. A linear function of temperature may generally be expressed by the following equation:

$$F(T)=K_A*T+K_B,$$

where adjustable coefficients $K_A$ and $K_B$ define slope and offset, respectively, for a given application. This may be accomplished by monitoring F(T) at two different temperatures T and adjusting coefficients $K_A$ and $K_B$ accordingly. However, this adjustment procedure is complicated by the fact that at any non-zero temperature T, both coefficients $K_A$ and $K_B$ affect the value of F(T) and generally cannot be adjusted independently. Therefore, it is desirable to develop a method of decoupling the effects of the slope and offset coefficients $K_A$ and $K_B$ on the linear temperature function F(T) such that independent adjustment of one of the coefficients at a non-zero temperature T can be achieved. Thus, the second coefficient can then be adjusted at a new temperature T by monitoring the change in the value of F(T) from the first temperature. According to the above decoupling, the linear function of temperature may be expressed by the following equation:

$$F(T)=K_x*(T-T_n)+K_y,$$

where $K_x$, $K_y$ and $T_n$ are adjustable co-efficients and T is the operating temperature. As can be seen, F(T) is equal to the co-efficient $K_y$ at temperature $T=T_n$ regardless of the value of the co-efficient $K_x$. Therefore, the co-efficient $K_x$ can be adjusted at any temperature without affecting the value of $F(T_n)$. This allows for independent adjustment of the co-efficient $K_x$ at any other temperature T.

As will be apparent to one skilled in the art, in order to realize the linear function of temperature F(T) and the decoupled two temperature adjustment method, a voltage signal may be generated as follows:

$$V(T)=K_x*(T-T_n)$$

With particular reference to FIG. 2, a first embodiment of the temperature dependent voltage generator circuit 26 is illustrated therein. The voltage generator circuit 26 is generally capable of generating an output voltage as a function temperature similar to the voltage generator circuit 26, whereas $T_n$ represents an aforementioned equation defining V(T). In the above equation, T represents the operating temperature of the voltage generator circuit 26, whereas $T_n$ represents an adjustable temperature term, and $K_x$ represents a scaling factor. Thus, the output voltage V(T) is proportional to the difference between the operating temperature T and the adjustable temperature $T_n$. As will be discussed in detail term $T_n$ can be easily adjusted. Therefore, at any below, the voltage generator circuit 26 is designed such that parameters representing the adjustable temperature operating temperature T, the output voltage V(T) can be "nulled" or forced equal to zero by adjusting the adjustable temperature term $T_n$ to equal the operating temperature T. Thereafter, with changes in the operating temperature T, the output voltage V(T) will be proportional to the difference between a given operating temperature T and the adjusted temperature term $T_n$. As will be apparent to one skilled in the art, generating a voltage of the form V(T) generally allows the aforementioned linear function of temperature F(T) to be realized.

In particular, the temperature dependent voltage generator circuit 26 includes a constant current source $I_1$, biased by voltage supply Vcc, which forces a constant current into a pair of series connected silicon diodes $D_1$ and $D_2$ which in turn are coupled to ground (GND). Diodes $D_1$ and $D_2$ have forward voltage drops which are temperature dependent. Accordingly, the constant current forces a change in voltage in response to a change in temperature as will be discussed later hereinafter. An operational amplifier 28 has a non-inverting input (+) coupled to a node located between the constant current source $I_1$ and the series connected silicon diodes $D_1$ and $D_2$. The inverting input (−) is coupled to the output of operational amplifier 28. A resistor $R_2$ is coupled between the output of operational amplifier 28 and a binary weighted switched current source $I_2$ which, in turn, is coupled to ground. A resistor $R_1$ is coupled at a node between voltage supply Vcc and the non-inverting input (+) of an operational amplifier 30 and the binary weighted switched current $I_2$. The inverting input (−) is coupled to an output 32 of operational amplifier 30.

In operation, the constant current supplied by constant current source $I_1$ is coupled to ground by diodes $D_1$ and $D_2$. This results in a voltage $V_1$ at node N, equalling the sum of two equal diode voltage drops $V_{D1}$ and $V_{D2}$ being supplied to the non-inverting input (+) of operational amplifier 28. This voltage $V_1$ is buffered by the operational amplifier 28 to resistor $R_2$. In accordance with the preferred embodiment, resistor $R_1$ and resistor $R_2$ have equal resistances such that a voltage $V_2$ equalling $Vcc/2+V_{D1}-I_2*R_1/2$ is supplied to the non-inverting input (+) of operational amplifier 30. An output voltage $V_T$ at the output 32 of operational amplifier 30 represents the difference between the reference voltage supply Vcc/2 and voltage $V_2$. Therefore, the voltage generator circuit 26 of FIG. 2 may generate an output voltage $V_T$ as follows:

$$V_T=(I_2*R_1/2-VD_1).$$

According to one embodiment, the diode voltage has a temperature dependence of approximately −2mV/° C. when supplied by the constant current from constant current source $I_1$. As will be discussed below, the binary switched weighted current source $I_2$ generates an adjustable binary weighted current which is substantially temperature independent by design and can be adjusted at any practical operating temperature T until $V_T$ is "nulled" or forced to zero. Because of the adjustment capability of current source $I_2$ and the characteristic of the diode voltage $V_{D1}$ varying substantially linearly with changes in temperature, the output voltage $V_T$ varies as a function of temperature in a manner similar to the above equation defining V(T).

With reference to FIG. 3, the binary weighted current source $I_2$ is illustrated in the form of a series of parallel binary weighted switched current sources, 40, 42, 44, and 46. Each of these current sources 40–46 are coupled to ground and are selectively coupled to electronic switches S1, S2, S3, and S4 to produce the adjustable binary switched current $I_2$. The electronic switches S1–S4 receive binary signals from memory cells 14 via lines 16E in order to be selectively closed. Each of the binary weighted current sources S1–S4 are weighted so as to conduct a different amount of current, i.e., $I_x$ through $I_x/8$. Each of the electronic switches S1 through S4 selectively couples one of the parallel binary weighted switched current sources to the binary weighted current $I_2$ for generating the current source I2 that is illustrated in FIG. 2. This allows the binary weighted current 12 to be adjusted in a binary fashion. For example, current source 46 sources a larger current equal to $I_x/8$ and current source 40 sources a current equal to $I_x$. Therefore, upon the closing of electronic switches S1 and S4, the binary weighted current $I_2$ has a value of IX+IX/8. As will be apparent to one skilled in the art, additional binary weighted switched current sources may be added in parallel in order to provide for a finer resolution of the adjustable binary weighted current $I_2$.

As indicated above, the adjustable binary weighted current $I_2$ is adjusted in order to "null" or force to zero the voltage $V_T$. This is accomplished by selectively closing any number of switches S1–S4 in order to generate the appropriate current $I_2$. Thereafter, with changes in the operating temperature T of circuit 26, the temperature dependent output voltage $V_T$ will vary proportionately with the changes in temperature. As previously mentioned, this is accomplished due to the temperature dependence of the diode voltage $V_{D1}$.

Turning to FIG. 4, an alternate embodiment of a temperature dependent voltage generator 48 is shown therein. The temperature dependent voltage generator circuit 48 is generally capable of generating an output voltage as a function of temperature similar to the aforementioned equation defining V(T), whereas T now represents the operating temperature of the voltage generator circuit 48.

In particular, temperature dependent voltage generator 48 includes transistors QD1, QD2, Q1 and Q2. Transistors QD1 and QD2 are preferably NPN configured bipolar transistors and are preferably configured as diode connected transistors. Transistor QD1 has a collector 50, an emitter 52, and a base 54. Transistor QD2 has a collector 56, an emitter 58, and a base 60. The collector 50 and base 54 of transistor QD1 and the collector 56 and base 60 of transistor QD2 are respectively coupled to one another. The emitter 52 of transistor QD1 is coupled to the collector 56 of transistor QD2, and the emitter 58 of transistor QD2 is coupled to ground. A constant current source $I_D$ is coupled to a reference voltage $V_{REF}$ and the collector 50 of transistor QD1. The current source $I_D$ supplies a constant current to the diode connected transistors QD1 and QD2 in a substantially temperature independent manner. Transistor Q1 includes a collector 62, an emitter 64 and a base 66. The emitter 64 is coupled to ground by resistor R1. Transistor Q2 has a collector 68, an emitter 70, and a base 72. The emitter 70 of transistor Q2 is coupled to ground (GND) by resistor R2. The collector 68 of transistor Q2 is coupled to the inverting input (−) of an operational amplifier 74 and to the output 76 of operational amplifier 74 by a resistor R4. A resistor R3 has a common connection to the noninverting input (+) of operational amplifier 74 and the collector 62 of transistor Q1 and a connection to the reference voltage $V_{REF}$.

In operation, the diode connected transistors QD1 and QD2 are driven by the constant current from current source $I_D$. This results in a voltage equal to two forward diode voltage drops, $2V_{BE}$, to the base 72 of transistor Q2, and one forward diode voltage drop, $V_{BE}$, to the base 66 of transistor Q1. As a result, the voltage appearing at the emitter 70 of transistor Q2 is essentially equal to one forward diode voltage drop, $V_{BE}$. This results in a current $I_2$ being conducted by transistor Q2 having a value equal to $V_{BE}/R2$.

The constant current from constant current source $I_D$ is generated in a dependent fashion such that $I_D=I_1$, where $I_1$ is the current conducted by transistor Q1. The voltage appearing at the emitter 64 of transistor Q1 is equal to the difference in voltage between the base to emitter voltage of transistor QD2 and the base to emitter voltage of transistor Q1. Therefore, the voltage appearing at the emitter 64 of transistor Q1 may be expressed as $kT/q, \ln(A_x)$ where k is Boltzman's constant, T is absolute temperature, $A_x$ is the ratio of emitter areas of transistor Q1 to transistor QD2, and q is charge on electron. As such, current at the emitter 64 of transistor Q1 may be represented by:

$$I1 = kT/q * \ln(Ax)/R_1.$$

Because the voltage at the output 76 of operational amplifier 74 is expressed as $V_{REF} - V_T$, the output voltage $V_T$ may be expressed by:

$$V_T = I_1 * R_3 - I_2 * R_4.$$

Therefore, substituting current $I_1$ and current $I_2$ in the above equation results in the output voltage being represented by:

$$V_T = kT/q * \ln(Ax) * (R_3 R_1) - V_{BE} * (R_4/R_2).$$

In the above equation, KT/q has a temperature dependence of approximately 0.0866 mV/°C. and the voltage $V_{BE}$ has a temperature dependence of approximately −2 mV/° C.

Turning to FIG. 5, in accordance with the preferred embodiment, resistor $R_2$ of FIG. 4 has been replaced by an equivalent R-2R resistor network 78 to provide for binary adjustment of the current $I_2$. As will be apparent to one skilled in the art, the R-2R ladder 78 is a conventional network employing resistors with resistances equalling $2R_2/3$ and $R_2/3$. The current $I_2$ represents a binary weighted current source illustrated by parallel current sources 80, 82 and 84 which source equal currents. Each of the current sources 80–84 are coupled to the R-2R resistor network via electronic switches $S_0$, $S_1$, and $S_2$. As explained in accordance with FIG. 3, switches $S_0$–$S_2$ receive binary signals from memory cells 14 in order to be selectively closed.

As discussed above, in operation, the voltage appearing at the base 72 of transistor Q2 is equal to two diode drops, $2V_{BE}$, across transistors QD1 and QD2. The current I2 flowing through transistor Q2 is now a binary weighted current which may be expressed as follows:

$$I_2 = V_{BE}/R_2 + IN*(S_2/2 + S_1/4 + S_0/8),$$

where $S_0$, $S_1$ and $S_2$ have a value of 0 or 1 depending on the status of the respective switches, i.e., 0 if a switch is open and 1 if a switch is closed. As such, the voltage $V_T$ may now be represented by the following equation:

$$V_T = kT/q * \ln(Ax) * (R_3/R_1) - V_{BE}*(R_4/R_2) - IN*R4*(S_2/2 + S_1/4 + S_0/8),$$

where T is the operating temperature of circuit 48. Thus, by selectively closing the switches $S_0$–$S_2$, current $I_2$ may be weighted in a binary fashion in order to "null" or force to zero the voltage $V_T$. As discussed above, the base to emitter voltage $V_{BE}$ and the term KT/q vary substantially linearly with changes in temperature. Therefore, because of this temperature dependence and the ability to weight the current $I_2$, the voltage $V_T$ can be "nulled" or forced to zero. Thereafter, the voltage $V_T$ will vary proportionally with changes in the temperature T.

Accordingly, the present invention provides a temperature dependent voltage that may be used to compensate for temperature dependent characteristics. The voltage may be nulled at a temperature to calibrate characteristics of a circuit. Thereafter temperature compensation may be realized.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. A temperature dependent voltage generator circuit with adjustable null voltage capability at a first operating temperature, said voltage generator circuit generates an output voltage which is proportional to changes in operating temperature from said first operating temperature, said voltage generator circuit comprising:

temperature dependent voltage source means for producing a voltage that varies substantially linearly with the changes in operating temperature from said first operating temperature; and binary weighted switched current source means for producing an adjustable binary weighted current, whereby said binary weighted switched current source means is adjustable at said first operating temperature so as to null said output voltage, and thereafter at other operating temperatures, said output voltage is proportional to the changes in the operating temperature from said first operating temperature.

2. The temperature dependent voltage generator circuit of claim 1, wherein said temperature dependent voltage source means includes a temperature dependent element coupled to a constant current for providing a voltage that is proportional to the changes in temperature from said first operating temperature.

3. The temperature dependent voltage generator circuit of claim 2, wherein said temperature dependent voltage source means further includes a current source that is substantially temperature independent for generating said constant current.

4. The temperature dependent voltage generator circuit of claim 2, wherein said temperature dependent element includes at least one diode.

5. The temperature dependent voltage generator circuit of claim 2, wherein said temperature dependent element includes at least one diode connected transistor.

6. The temperature dependent voltage generator circuit of claim 1, wherein said binary weighted switched current source means includes at least one current source and at least one electronic switch, whereby said at least one electronic switch selectively couples said at least one current source to said adjustable binary weighted current for weighting said binary weighted current.

7. The temperature dependent voltage generator circuit of claim 1, wherein said binary weighted switched current source means includes a plurality of parallel current sources and a plurality of electronic switches, whereby each of said plurality of electronic switches selectively couples one of said plurality of current sources to said adjustable binary weighted current for weighting said adjustable binary weighted current.

8. A temperature dependent voltage generator circuit with adjustable null voltage capability at a first operating temperature, said voltage generator circuit generates an output voltage at a second operating temperature which is proportional to a change in temperature from said first operating temperature to said second operating temperature, said voltage generator circuit comprising:

a current source that is substantially temperature independent for generating a constant current;

a temperature dependent element coupled to said constant current for providing a voltage that is proportional to the change in operating temperature from said first operating temperature to said second operating temperature; and binary weighted switched current source means for providing an adjustable binary weighted current, whereby said binary weighted switched current source means is adjustable at said first operating temperature so as to null said output voltage, and whereby said output voltage at said second operating temperature is proportional to the change in temperature from said first operating temperature to said second operating temperature.

9. The temperature dependent voltage generator circuit of claim 8, wherein said temperature dependent element includes at least one diode.

10. The temperature dependent voltage generator circuit of claim 8, wherein said temperature dependent element includes at least one diode connected transistor.

11. The temperature dependent voltage generator circuit of claim 8, wherein said binary weighted switched current source means includes at least one current source and at least one electronic switch, whereby said at least one electronic switch selectively couples said at least one current source to said adjustable binary weighted current for weighting said adjustable binary weighted current.

12. The temperature dependent voltage generator circuit of claim 8, wherein said binary weighted switched current source means includes a plurality of parallel current sources and a plurality of electronic switches, whereby each of said plurality of electronic switches selectively couples one of said plurality of current sources to said adjustable binary weighted current for weighting said binary weighted current.

13. A method of generating a temperature varying output voltage from a temperature dependent voltage generator circuit, said output voltage varying proportionally in response to a change in operating temperature of said circuit from a first operating temperature to a second operating temperature, said method comprising the steps of:

operating said circuit at said first operating temperature;

generating said output voltage at said first operating temperature;

adjusting a binary weighted switched current source which produces a binary weighted current at said first operating temperature so as to null said output voltage;

operating said circuit at said second operating temperature; and generating said output voltage at said second operating temperature, whereby said output voltage is proportional to the change in the operating temperature from said first operating temperature to said second operating temperature.

14. The method of claim 13 wherein said step of generating said output voltage at said first operating temperature includes the step of:

applying a constant current source that is substantially temperature independent to a temperature dependent element.

15. The method of claim 13 wherein said step of adjusting said binary weighted switched current source includes the step of:

closing a first electronic switch for coupling a first current source of a series of current sources to said binary weighted current, whereby said first current source provides current for weighting said binary weighted current.

16. The method of claim 15 wherein said step of adjusting said binary weighted switched current source further includes the step of:

closing a second electronic switch for coupling a second current source of said series of current sources to said binary weighted current, whereby said second current source provides current for further weighting said binary weighted current.

\* \* \* \* \*